(12) United States Patent
Hagimoto et al.

(10) Patent No.: US 9,425,583 B2
(45) Date of Patent: Aug. 23, 2016

(54) ALGAINP-BASED SEMICONDUCTOR LASER

(71) Applicant: USHIO OPTO SEMICONDUCTORS, INC., Tokyo (JP)

(72) Inventors: Masato Hagimoto, Saku (JP); Haruki Fukai, Komoro (JP); Tsutomu Kiyosumi, Ueda (JP); Shinji Sasaki, Miyota (JP); Satoshi Kawanaka, Komoro (JP)

(73) Assignee: USHIO OPTO SEMICONDUCTORS, INC., Tokyo (JP)

( * ) Notice: Subject to any disclaimer, the term of this patent is extended or adjusted under 35 U.S.C. 154(b) by 0 days.

(21) Appl. No.: 13/714,508

(22) Filed: Dec. 14, 2012

(65) Prior Publication Data

US 2013/0182735 A1    Jul. 18, 2013

(30) Foreign Application Priority Data

Jan. 12, 2012 (JP) .................................. 2012-4283

(51) Int. Cl.
*H01S 5/22* (2006.01)
*H01S 5/343* (2006.01)
(Continued)

(52) U.S. Cl.
CPC ............... *H01S 5/3211* (2013.01); *B82Y 20/00* (2013.01); *H01S 5/3013* (2013.01);
(Continued)

(58) Field of Classification Search
CPC ... H01S 5/3213; H01S 5/2031; H01S 5/3013; H01S 5/34326; H01S 5/3436; H01S 5/32325
USPC ...................................................... 372/45.01
See application file for complete search history.

(56) References Cited

U.S. PATENT DOCUMENTS

| 5,204,284 | A | * | 4/1993 | Kuo et al. ....................... 438/37 |
| 5,850,411 | A | * | 12/1998 | Major et al. ............. 372/45.013 |
| 2004/0206961 | A1 | * | 10/2004 | Yamada et al. ................. 257/79 |
| 2008/0043797 | A1 | | 2/2008 | Takayama et al. |
| 2010/0309941 | A1 | | 12/2010 | Ito |

FOREIGN PATENT DOCUMENTS

| JP | 2002-217495 A | 8/2002 |
| JP | 2006-120968 A | 5/2006 |

(Continued)

OTHER PUBLICATIONS

Bour et al., "Strained GaxIn1-xP/(AlGa)0.5In0.5P heterostructures and quantum-well laser diodes", IEEE Journal of Quantum Electronics—IEEE J Quantum Electron, Feb. 2, 1994, vol. 30, No. 2, pp. 593-607.

(Continued)

*Primary Examiner* — Jessica Stultz
*Assistant Examiner* — Marcia Golub-Miller
(74) *Attorney, Agent, or Firm* — Hubbs, Enatsky & Inoue PLLC (57) ABSTRACT

An aluminium gallium indium phosphide (AlGaInP)-based semiconductor laser device is provided. On a main surface of a semiconductor substrate formed of n-type GaAs (gallium arsenide), from the bottom layer, an n-type buffer layer, an n-type cladding layer formed of an AlGaInP-based semiconductor containing silicon (Si) as a dopant, an active layer, a p-type cladding layer formed of an AlGaInP-based semiconductor containing magnesium (Mg) or zinc (Zn) as a dopant, an etching stopper layer, and a p-type contact layer are formed. Here, when an Al composition ratio x of the AlGaInP-based semiconductor is taken as a composition ratio of Al and Ga defined as $(Al_xGa_{1-x})_{0.5}In_{0.5}P$, a composition of the n-type cladding layer is expressed as $(Al_{xn}Ga_{1-xn})_{0.5}In_{0.5}P$ ($0.9 < xn < 1$) and a composition of the p-type cladding layer is expressed as $(Al_{xp}Ga_{1-xp})_{0.5}In_{0.5}P$ ($0.9 < xp \le 1$), and xn and xp satisfy a relationship of $xn < xp$.

20 Claims, 10 Drawing Sheets

(51) Int. Cl.
  *H01S 5/32* (2006.01)
  *H01S 5/30* (2006.01)
  *B82Y 20/00* (2011.01)
  *H01S 5/00* (2006.01)
  *H01S 5/022* (2006.01)
  *H01S 5/20* (2006.01)

(52) U.S. Cl.
  CPC .......... *H01S 5/3213* (2013.01); *H01S 5/34326* (2013.01); *H01S 5/0021* (2013.01); *H01S 5/02212* (2013.01); *H01S 5/2004* (2013.01); *H01S 5/209* (2013.01); *H01S 5/2031* (2013.01); *H01S 5/22* (2013.01); *H01S 5/305* (2013.01); *H01S 5/3063* (2013.01); *H01S 2301/18* (2013.01)

(56) References Cited

FOREIGN PATENT DOCUMENTS

| | | |
|---|---|---|
| JP | 2008-047639 | 2/2008 |
| JP | 2010-283279 | 12/2010 |
| JP | 2011-023493 A | 2/2011 |

OTHER PUBLICATIONS

Stimulated emission in $In_{0.5}(Al_xGa_{1-x})_{0.5}P$ quantum well heterostructures, C.P. Kuo et al., Journal of Crystal Growth vol. 93, Issues 1-4, 1988, pp. 389-395. The year of publication is sufficiently earlier than the effective U.S. filing date and any foreign priority date so that the particular month of publication is not in issue.

* cited by examiner

ALGAINP-BASED SEMICONDUCTOR LASER

CROSS-REFERENCE TO RELATED APPLICATION

The present application claims priority from Japanese Patent Application No. 2012-004283 filed on Jan. 12, 2012, the content of which is hereby incorporated by reference into this application.

TECHNICAL FIELD OF THE INVENTION

The present invention relates to a semiconductor laser. More particularly, the present invention relates to technique effectively applied to a semiconductor laser using an aluminium gallium indium phosphide (AlGaInP)-based semiconductor.

BACKGROUND OF THE INVENTION

Japanese Patent Application Laid-Open Publication No. 2002-217495 (Patent Document 1) discloses technique of suppressing impurity diffusion to an active layer and also increasing characteristic temperature and modulation frequency for a semiconductor laser in which at least an n-type cladding layer, a bottom optical wave guiding layer, an active layer, a top optical guiding layer and a p-type cladding layer are stacked on a semiconductor substrate.

More specifically, by using $Al_{0.5}In_{0.5}P$ which is lattice-matched to a gallium arsenide (GaAs) substrate and having the largest bandgap among AlGaInP-based semiconductors to the p-type cladding layer and the n-type cladding layer to obtain a bandgap difference between the active layer and the cladding layers, electron overflow from the active layer to the p-type cladding layer is suppressed. Also, diffusion of a dopant (zinc (Zn), selenium (Se)) doped to the p-type cladding layer and the n-type cladding layer at a high concentration, i.e., $1 \times 10^{18}$ $cm^{-3}$ into the active layer is suppressed by providing an undoped layer between the active layer and the p-type cladding layer and between the active layer and the n-type cladding layer, respectively.

Japanese Patent Application Laid-Open Publication No. 2006-120968 (Patent Document 2) discloses technique of improving efficiency and temperature characteristics of a semiconductor laser having an active layer between an n-type cladding layer and a p-type cladding layer. More specifically, according to Patent Document 2, generation of misfit dislocation is suppressed by forming the p-type cladding layer and the n-type cladding layer with lattice-aligned $Al_{0.5}In_{0.5}P$ and introducing a strained layer for inhibiting overflow of electrons between the active layer and the p-type cladding layer as well as making the thickness of the strained layer smaller than or equal to a critical thickness.

Japanese Patent Application Laid-Open Publication No. 2011-023493 (Patent Document 3) discloses technique of reducing catastrophic optical damage (COD) at end facets and also improving stability of output beam for an AlGaInP-based semiconductor laser of a horizontal cavity type having a lasing wavelength shorter than 650 nm. More specifically, according to Patent Document 3, dissipation of an optical waveguide structure near end facets occurring when a window structure is formed by diffusion of an impurity such as Zn near end facets is suppressed by forming the optical waveguide layer excluding a well layer with $(Al_xGa_{1-x})InP$ where $x>0.66$. In addition, in the semiconductor laser, the n-type cladding layer and the p-type cladding layer are formed of $Al_{0.51}In_{0.49}P$ or $(Al_{0.9}Ga_{0.1})_{0.51}In_{0.49}P$.

Note that, a band gap of an AlGaInP-based semiconductor is 2.3 eV when x=0.7 in $(Al_xGa_{1-x})_{0.5}In_{0.5}P$. However, it is reported that the bandgap is 2.35 eV when x=1 and it is the largest value among AlGaInP-based semiconductors (see D. P. Bour, R. S. Geels, D. W. Treat, T. L. Paoli, F. Ponce, R. L. Thornton, B. S. Krusor, R. D. Bringans, D. F. Welch (1994). "Strained GaxIn1−xP/(AlGa) 0.5In0.5P heterostructures and quantum-well laser diodes", IEEE Journal of Quantum Electronics—IEEE J QUANTUM ELECTRON, vol. 30, no. 2, pp. 593-607 (Non-Patent Document 3)).

SUMMARY OF THE INVENTION

Application of a red semiconductor laser used as a light source for DVDs to small-size projectors laser displays such as a red light source has been advanced.

When using a red semiconductor laser as a light source for projectors, high-temperature operation and high-optical output power operation for corresponding to improvements in luminance of projectors or improvements in luminosity factor by shortening the wave length are required. In addition, the red semiconductor laser has been required to correspond to high-temperature operation eyeing usages for mobile devices and in-car usages.

However, semiconductor lasers have problems of difficulties in achieving good high-temperature and high-optical output power characteristics due to significant influences of electron overflow into a p-type cladding layer from an active layer caused by a temperature increase in a vicinity of the active layer upon high-temperature and high-optical output power operation.

Existing lasing wavelengths of red semiconductor lasers for DVDs are around 660 nm. In comparison, lasing wavelengths around 640 nm are required of red semiconductor lasers for displays. However, the shorter the lasing wavelengths are, the smaller the bandgap difference between the active layer and the p-type cladding layer is and the more significant carrier overflow upon high-temperature operation is. Therefore, achieving improvements in high-temperature characteristics is a problem.

Generally, one of the characteristics of AlGaInP-based materials is that the larger the Al composition ratio is, the larger the bandgap is and the lower the refractive index is. Therefore, in view of high-temperature characteristics, it is preferable to make the Al composition ratio of the cladding layer as large as possible. However, a problem in reliability occurs such that the larger the Al composition ratio is, the lower the crystallinity is and the more significant diffusion of dopant is. Accordingly, the Al composition ratio of the cladding layer has been set at about 0.6 to 0.7 for the red semiconductor lasers having lasing wavelengths around 660 nm, in consideration of high-temperature characteristics and reliability.

However, as the carrier overflow at high temperature is more significant in the red semiconductor lasers having lasing wavelengths around 640 nm, it is required to further improve high-temperature characteristics and thus it is desirable to make the Al composition of the cladding layer ratio as large as possible. Therefore, when AlInP having the largest Al composition ratio is used as material of the cladding layer, the bandgap difference between the active layer and the cladding layer is maximum and also the refractive index of the cladding layer is minimum and thus there is a merit that optical confinement in the active layer can be large.

As the technique disclosed in Patent Document 1 described above, technique of improving temperature characteristics by using AlInP in the p-type cladding layer and the n-type cladding layer and of preventing dopant diffusion by providing undoped layers between the active layer and the p-type cladding layer and between the active layer and the n-type cladding layer has been known.

However, as described below, the inventors of the present invention have examined reliability of a red semiconductor laser device using a lasing wavelength of 640 nm in which AlInP is used in a p-type cladding layer and an n-type cladding layer and the reliability was thousand-hour scale as a result. Although the reliability is at a practical level for general usages of semiconductor lasers, it has been found out that using AlInP in the p-type cladding layer and the n-type cladding layer cannot sufficiently correspond to high requirements in reliability, i.e., ten thousand hours or longer that is required of light sources for laser displays.

A preferred aim of the present invention is to provide technique capable of achieving both improvements in high-temperature characteristics and improvements in reliability of semiconductor laser devices using AlGaInP-based semiconductors.

The above and other preferred aims and novel characteristics of the present invention will be apparent from the description of the present specification and the accompanying drawings.

The typical ones of the inventions disclosed in the present application will be briefly described as follows.

A semiconductor laser of a preferred embodiment of the present invention is provided with a semiconductor laser including: an n-type cladding layer having a composition of $(Al_{xn}Ga_{1-xn})_{0.5}In_{0.5}P$ where $0.9<xn<1$; a p-type cladding layer having a composition of $(Al_{xp}Ga_{1-xp})_{0.5}In_{0.5}P$ where $0.9<xp\leq 1$; and an active layer provided between the n-type cladding layer and the p-type cladding layer, in which a relationship of an Al composition ratio xn of the n-type cladding layer and an Al composition ratio xp of the p-type cladding layer satisfies $xn<xp$.

The effects obtained by typical aspects of the present invention will be briefly described below.

Both improvements in high-temperature characteristics and improvements in reliability of semiconductor laser devices using AlGaInP can be achieved.

DESCRIPTIONS OF THE PREFERRED EMBODIMENTS

Hereinafter, embodiments of the present invention will be described in detail with reference to the accompanying drawings.

Note that components having the same function are denoted by the same reference symbols throughout the drawings for describing the embodiment, and the repetitive description thereof will be omitted.

(First Embodiment)

Figure 1:
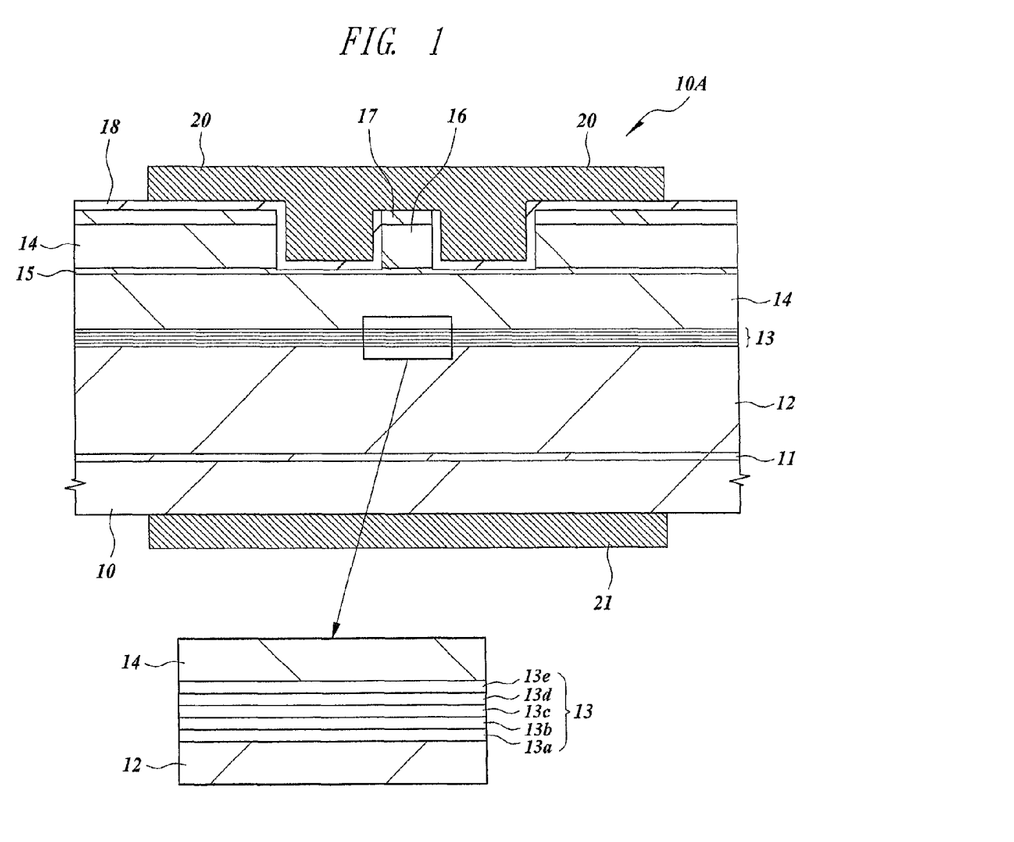
FIG. 1 is a cross-sectional view illustrating a configuration of a main part of a semiconductor laser device according to a first embodiment of the present invention.

A first embodiment is applied to a red semiconductor laser having a lasing wavelength of 640 nm. FIG. 1 is a cross-sectional view illustrating a configuration of a main part (laser chip) in the semiconductor laser according to the present embodiment.

As illustrated in FIG. 1, a laser chip 10A includes a semiconductor substrate 10 formed of n-type GaAs (gallium arsenide). On a main surface of the semiconductor substrate 10, an n-type buffer layer 11, an n-type cladding layer 12, an active layer 13, a p-type cladding layer 14, an etching stopper layer 15, and a p-type contact layer 17 are formed in this order from the bottom.

The n-type buffer layer 11 is formed of GaAs containing Si (silicon) as a dopant. The n-type cladding layer 12 is formed of AlGaInP (aluminium gallium indium phosphide) containing Si (silicon) as a dopant. Here, when taking an Al composition ratio "x" (Al composition ratio of Al and Ga in a compound semiconductor defined by $(Al_{xn}Ga_{1-xn})_{0.5}In_{0.5}P$) of the n-type cladding layer as "xn", xn satisfies $0.9<xn<1$, where xn=0.95, i.e., $(Al_{0.95}Ga_{0.05})_{0.5}In_{0.5}P$ in the present embodiment.

In addition, a Si concentration of the n-type cladding layer 12 is $3\times 10^{17}$ cm$^{-3}$ and a thickness of the n-type cladding layer 12 is 2.5 μm. When the dopant concentration of the n-type cladding layer 12 is low, an increase in series resistance is posed and when the dopant concentration is high, a lowering of slope efficiency due to an increase in internal loss is posed. Therefore, the dopant concentration which makes it possible to prevent both an increase in series resistance and a lowering of slope efficiency is preferable to be set within a range from $1\times 10^{17}$ cm$^{-3}$ to $6\times 10^{17}$ cm$^{-3}$.

The active layer 13 is formed in a multi quantum well (MQW) structure in which an optical guiding layer 13a formed of AlGaInP, a well layer 13b formed of GaInP or AlGaInP, a barrier layer 13c formed of AlGaInP, and a well layer 13d formed of GaInP or AlGaInP, and an optical guiding layer 13e formed of AlGaInP are stacked. A lowering in reliability of the active layer 13 due to dopant diffusion into the well layers 13b and 13d can be prevented by making the above-mentioned layers 13a to 13e undoped, respectively.

For efficiently confining light in the well layers 13b and 13d, thicknesses of the optical guiding layers 13a and 13e are 20 to 150 nm and Al composition ratios x of the optical guiding layers 13a and 13e are 0.4 to 0.8. For example, to obtain a beam spread angle in a direction perpendicular to the active layer 13 at 18° (full width at half maximum), the thickness is set at 25 nm and the Al composition ratio x is set at 0.7.

The well layers 13b and 13d can be given various lasing wavelengths and oscillation modes by changing their thicknesses within a range smaller than or equal to a critical thickness, compositions and strains. When the well layers are unstrained or compressive strain is given, the thickness is preferably 3 to 6 nm and the Al composition ratio x is preferably 0 to 0.15. For example, to set the lasing wavelength at 640 nm, the thickness is 5 nm and the Al composition ratio x is 0.1 and a compressive strain of +0.8% is given. In this case, oscillation is generated in a TE mode in which electric-field components of the laser beam are vibrated in a direction parallel to the active layer 13.

A thickness of the barrier layer 13c is 5 to 10 nm and a composition of the barrier layer 13c is the same as the optical guiding layers 13a and 13e. Note that, the composition of the barrier layer 13c may be different from that of the optical guiding layers 13a and 13e and a structure in which a plurality of the barrier layers 13c sandwich the well layers 13b and 13d may be used.

Note that, while a MQW structure in which the number of the well layers is two has been used here, a single quantum well (SQW) structure in which the number of the well layers is one may be used. When using the single quantum well (SQW) structure, since the volume of the well layer is reduced, it is easier to increase the carrier density inside the well layer and a threshold gain can be obtained even when the injection current is small; therefore, there is an advantage that a threshold current for laser oscillation can be largely reduced.

The p-type cladding layer 14 is formed of AlGaInP containing Mg (magnesium) or Zn (zinc) as a dopant. Here, when taking an Al composition ratio x of the p-type cladding layer 14 as xp, xp satisfies $0.9 < xp \leq 1$. In the present embodiment, xp=1, that is, $Al_{0.5}In_{0.5}P$.

A preferable dopant concentration of the p-type cladding layer 14 is $1 \times 10^{18}$ cm$^{-3}$. In addition, a preferable thickness is 1.25 μm to be smaller than a thickness of the n-type cladding layer 12. To improve high-temperature characteristics and to reduce serial resistance, it is preferable to make the dopant concentration of the p-type cladding layer 14 as high as possible. However, when the Al composition ratio x is high, the dopant is prone to diffuse. Therefore, to prevent degradation of characteristics and lowering of reliability, it is preferable to set the dopant concentration within a range of $6 \times 10^{17}$ to $1.3 \times 10^{18}$ cm$^{-3}$.

When using an asymmetric structure in which the Al composition ratio xp of the p-type cladding layer 14 is higher than the Al composition ratio xn of the n-type cladding layer 12 like the present embodiment, the optical distribution is biased toward the n-type cladding layer 12 side. Therefore, there is an effect of improving the slope efficiency when setting the dopant concentration of the n-type cladding layer 12 lower than that of the p-type cladding layer 14. In addition, as to the type of the dopant, it is preferable to use Mg which is less prone to diffuse than Zn. Moreover, although the thickness of the p-type cladding layer 14 is preferable to be as small as possible for reducing series resistance, lowering of the slope efficiency is significant when the thickness is too small. A ridge portion (ridge waveguide) 16 extending in a stripe pattern along a direction perpendicular to the paper sheet is formed to the p-type cladding layer 14. A height of the ridge portion 16 is 1 μm and a width of the ridge portion 16 is 2 μm. The ridge portion 16 is oscillated in a single mode (single transverse mode). The p-type contact layer 17 formed of GaAs containing Zn as a dopant is formed to an upper portion of the ridge portion 16.

In addition, the etching stopper layer 15 is provided to the p-type cladding layer 14 at a height that is about 0.25 μm from the active layer 13. The etching stopper layer 15 is a layer for stopping etching in the middle of forming the ridge portion 16 by etching the p-type cladding layer 14. The etching stopper layer 15 is formed of an AlGaInP layer having a different Al composition ratio x than the p-type cladding layer 14 for giving an etching selectivity with respect to the p-type cladding layer 14. The etching stopper layer 15 of the present embodiment is formed of, for example, GaInP in which the Al composition ratio x is zero, and has a thickness of 3 nm. Note that, when etching conditions of the p-type cladding layer 14 can be controlled well, the etching stopper layer 15 may be omitted.

A passivation film 18 formed of an insulating film such as silicon oxide film, silicon nitride film, or aluminum oxide film is formed to each of sidewalls of the ridge portion 16 and the p-type contact layer 17 and planar portions (upper surfaces of the etching stopper layer 15) in a vicinity of both sides of the ridge portion 16.

Each of the semiconductor layers formed on the main surface of the semiconductor substrate 10 is deposited by metal organic chemical vapor deposition (MOCVD). In addition, the passivation film 18 is formed by depositing an insulating film on the semiconductor substrate 10 to which the p-type contact layer 17 is formed by CVD and then selectively etching only the insulating film at an upper portion of the p-type contact layer 17 so that an upper surface of the p-type contact layer 17 is exposed.

A p-side electrode 20 to be electrically connected to the p-type contact layer 17 is formed to an upper portion of the passivation film 18. On the other side of the p-side electrode 20, an n-side electrode 21 is formed to a rear surface of the semiconductor substrate 10. Each of the p-side electrode 20 and the n-side electrode 21 includes an Au film and is formed of a metal film capable of making an ohmic contact.

The Al composition ratio xp of AlInP forming the p-type cladding layer 14 is preferable to be as high as possible in view of high-temperature characteristics and thus it is set at 1 at the maximum in the present embodiment. Then, on that basis, the Al composition ratio xn of AlGaInP forming the n-type cladding layer 12 is set at 0.95.

In this manner, the semiconductor laser device of the present embodiment has an asymmetric structure in which the Al composition ratio x differs in the n-type cladding layer 12 and the p-type cladding layer 14 and the Al composition ratio x of the p-type cladding layer 14 is higher than that of the n-type cladding layer 12. Therefore, penetration of light is biased toward the n-type cladding layer 12 side where the refractive index is larger. There are advantages as follows.

More specifically, there is an effect of improving the slope efficiency because, when the penetration of light into the p-type cladding layer 14 is reduced, it is possible to reduce light absorption in the p-type contact layer 17 which is formed of GaAs that is an absorber of light having a wavelength of 640 nm. In addition, as the present embodiment, when the dopant concentration of the n-type cladding layer 12 is made lower than that of the p-type cladding layer 14, more light is distributed in the n-type cladding layer 12 having a lower dopant concentration and thus it is possible to reduce internal loss occurring due to free-carrier overflow in the cladding layers.

Reduction of the light penetration into the p-type cladding layer 14 means enabling thickness reduction of the p-type cladding layer 14. When the p-type cladding layer 14 is thinner, an effect of reducing heat generation amount by a reduction in series resistance and an effect of improving exhaust heat are achieved and thus high-temperature characteristics are improved. Further, when the light distribution is biased toward the n-type cladding layer 12 side, it is necessary to ensure a refractive index difference by making the thickness of the p-type cladding layer 14 under the etching stopper 15 thinner for ensuring a refractive index difference in a direction horizontal to the active layer 13 (ensuring a same level of FFP horizontal half width). However, by reducing the thickness of the p-type cladding layer 14 under the ridge portion 16, reactive current which does not contribute to laser oscillation is reduced and thus threshold current can be reduced.

On the other hand, in the asymmetric structure in which the Al composition ratio x differs in the n-type cladding layer 12 and the p-type cladding layer 14, when the Al composition ratio difference between the n-type cladding layer 12 and the p-type cladding layer 14 is increased, due to variations in compositions, the waveguide mode may be unstable and/or variations in characteristics may be increased. Further, when the Al composition ratio difference is extremely large so that a point of the maximum light intensity is positioned at a boundary of the active layer 13 and the cladding layers, even a fundamental mode is cut off and laser oscillation is not permitted. Therefore, there is an upper limit in the Al composition ratio difference between the n-type cladding layer 12 and the p-type cladding layer 14.

Figure 2:
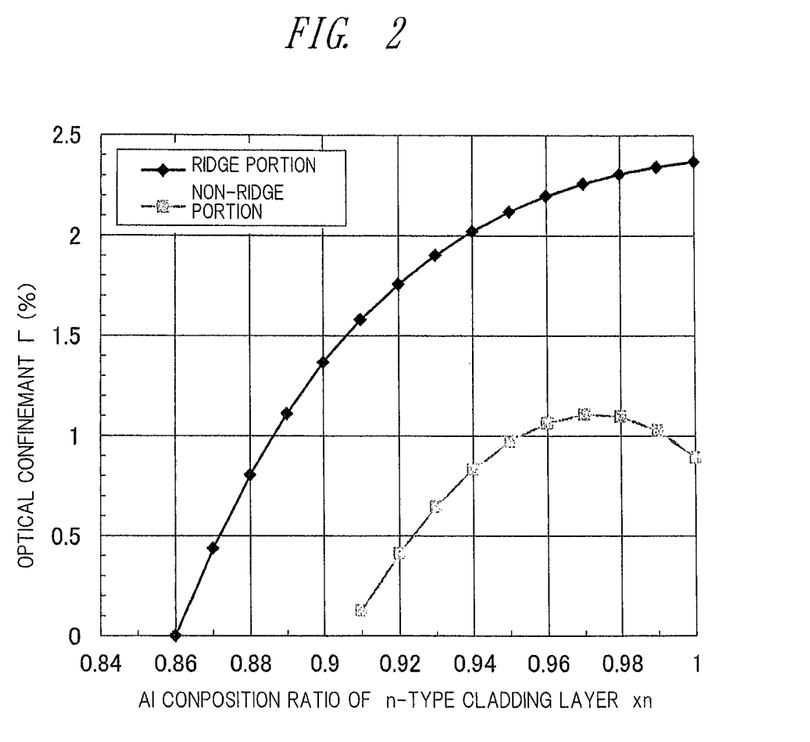
FIG. 2 is a graph illustrating a result of calculating optical confinement Γ into an active layer where a composition of a p-type cladding layer is fixed and an Al composition ratio of an n-type cladding layer is changed.

Accordingly, the upper limit in the Al composition ratio difference of the n-type cladding layer 12 and the p-type cladding layer 14 was examined by a calculation. FIG. 2 illustrates a result of a calculation of optical confinement coefficient .GAMMA. of optical confinement into the active layer 13 where the composition of the p-type cladding layer 14 is fixed to Al.sub.0.5In.sub.0.5P and the Al composition ratio xn of the n-type cladding layer 12 is varied based on the structure of the present embodiment described above. For example as shown in FIG. 2 xn has the values of 0.91, 0.92, 0.93, 0.94, 0.95, 0.96, 0.97, 0.98, 0.99 and 1.

Figure 3:
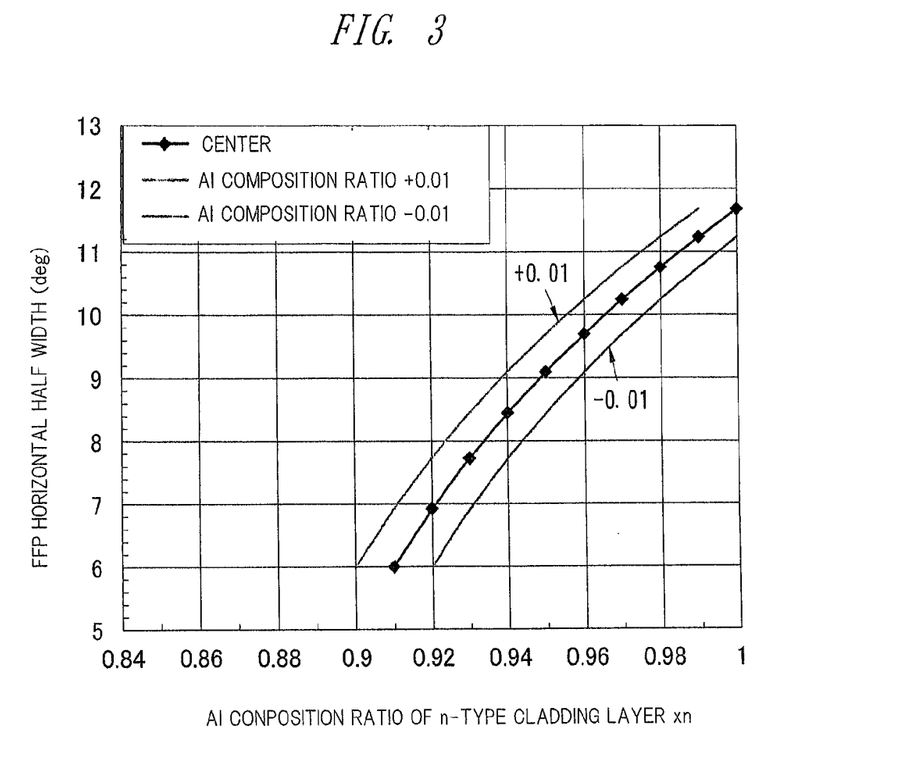
FIG. 3 is a graph illustrating a calculation result of an FFP horizontal half width.

The smaller the Al composition ratio xn of the n-type cladding layer 12, the smaller the optical confinement coefficient Γ. When the Al composition ratio xn is 0.9, light does not enter the active layer 13 in a non-ridge portion and thus laser oscillation is not permitted. Therefore, it is understood that the Al composition difference of the n-type cladding layer 12 and the p-type cladding layer 14 is required to be smaller than 0.1. Here, when a lowering rate of optical confinement having the Al composition ratio x=0.92 is converted into threshold current, the lowering rate corresponds to a lowering by 20% or more. An increase in threshold current poses an increase in reactive current and it lowers high-temperature characteristics and reliability. Therefore, it is preferable to set the increased amount to 20% or smaller, that is, it is preferable to set the Al composition ratio difference to 0.08 or smaller. It is especially preferable to set the Al composition ratio difference to 0.05 or smaller for increasing optical confinement when the Al composition ratio xp is 1, as shown in FIG. 2. The calculation result explained above means that light is not permitted to enter the ridge portion 16 abruptly as the Al composition ratio xn of the n-type cladding layer 12 is decreased and it largely affects the FFP in the horizontal direction among other characteristics values. Accordingly, influence on the beam spread angle in the FFP horizontal direction given by the Al composition ratio difference was further examined. FIG. 3 illustrates a calculation result of FFP horizontal half width.

When the inventors of the present invention confirmed variations in Al composition ratio x among wafers, it was found that there was a variation of about .+-.0.01 from a target value. Accordingly, assuming that a variation is .+-.0.01 in mass production, the influence on the FFP horizontal half width is illustrated with the case of shifting the Al composition ratio x by +0.01 and the case of shifting the Al composition ratio x by −0.01 together in FIG. 3. Accordingly an approximate value of the composition ratio xn or xp is accurate to within +/−0.01. In other words an approximate xn or xp value of 0.95 would be between 0.94 and 0.96.

As illustrated in FIG. 3, the smaller the Al composition ratio xn of the n-type cladding layer 12, that is, the larger the Al composition ratio difference from the p-type cladding layer 14, the larger the influence on the FFP horizontal half width. In addition, in accordance with customer's demands, that is, restrictions in optical design, it is necessary to suppress the FFP horizontal half width from 6 to 12 degrees, that is, a range within 6 degrees. To achieve that, in consideration of fluctuations in the Al composition ratio x in mass production, the Al composition ratio difference of the n-type cladding layer 12 and the p-type cladding layer 14 is preferable to be smaller than or equal to 0.08.

To confirm the effects of the present embodiment, the inventors of the present invention made a semiconductor laser and carried out an evaluation of characteristics and reliability on the semiconductor laser. A wafer was cleaved with a cavity length of 2500 μm and a passivation film is used at end facets. To evaluate characteristics and reliability, a chip (laser chip) to which the semiconductor laser is formed was mounted on a sub-mount in the junction-down manner and then the sub-mount was loaded on a stem and the chip was hermetic sealed with a cap. Also, as a comparative example of the present embodiment, a semiconductor laser in which an n-type cladding layer and a p-type cladding layer are formed with $Al_{0.5}In_{0.5}P$ was made.

Figure 4:
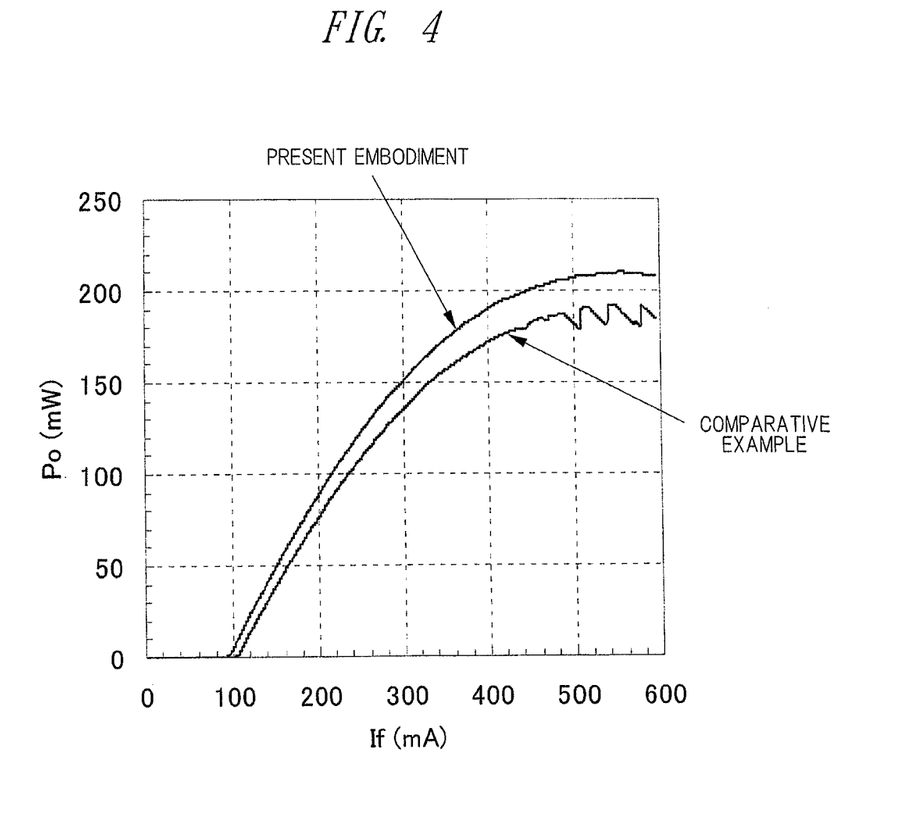
FIG. 4 is a graph illustrating I-L shapes at high temperature of the first embodiment and a comparative example.

FIG. 4 illustrates high-temperature I-L shapes of the present embodiment and the comparative example. The measurement conditions are 50° C. and CW. In the present embodiment, the threshold current was smaller than the comparative example by about 10% and the optical output power was larger than the comparative example by 10% or more. In addition, although a kink was generated in the comparative example, a kink was not found in the present embodiment and thus the I-L characteristic is good in the present embodiment. The improvements in the high-temperature characteristics in the present embodiment is considered to be achieved by an effect of an improvement in crystallinity of the active layer, which will be described in detail below, in addition to the effects of a reduction in heat generation amount and an improvement in slope efficiency by a reduction in threshold current.

Figure 5:
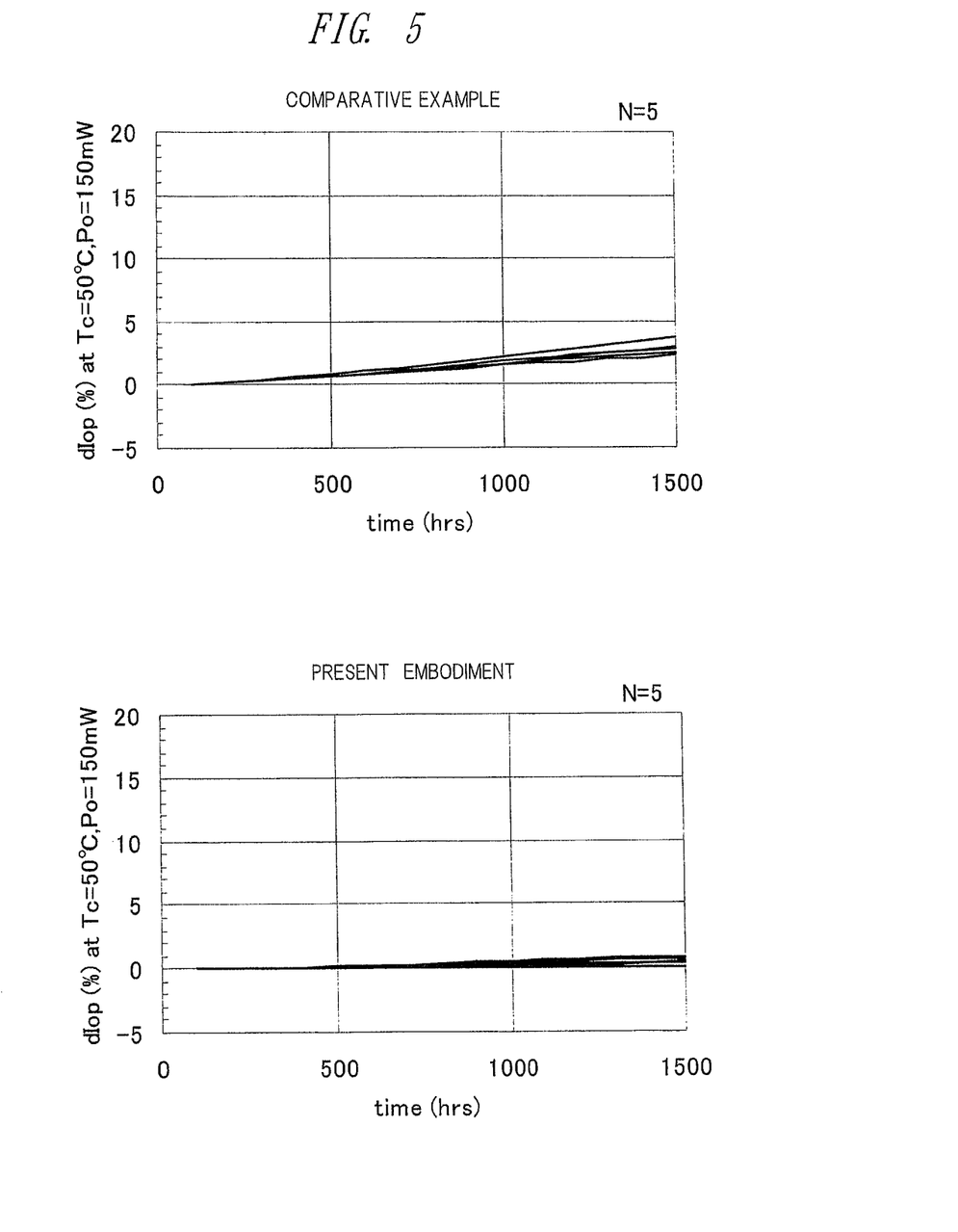
FIG. 5 is graph illustrating lifetime test results of the first embodiment and the comparative example.

FIG. 5 illustrates results of lifetime test of the present embodiment and the comparative example. Test conditions are 50° C. and 150 mW CW-APC. In the comparative example, an increased ratio of operation current after 1500 hours was 2.5 to 4%. On the contrary, an increased ratio of operation current after 1500 hours was 0 to 1% in the present embodiment. A reason of this result is considered as follows.

Generally, as Al is prone to be oxidized in property, when AlInP having a high Al composition ratio x is made by crystal growth in MOCVD, oxygen and/or moisture in the air is absorbed on AlInP and it makes crystallinity to degrade easily. In addition, degradation in crystallinity in the n-type cladding layer influences quality of the active layer which will be grown on the n-type cladding layer. Therefore, when AlInP is used in the n-type cladding layer like the comparative example, a reason of the lowering in reliability occurred is considered such that dislocations threading the active layer were increased due to degradation in crystallinity in the n-type cladding layer and multiplication of dislocations became more prone to occur when the laser element was operated for a long time. On the other hand, in the present embodiment setting the Al composition ratio xn of the n-type cladding layer at 0.95, it is considered such that multiplication of dislocations in the active layer was suppressed by an improvement in crystallinity in the n-type cladding layer.

Figure 6:
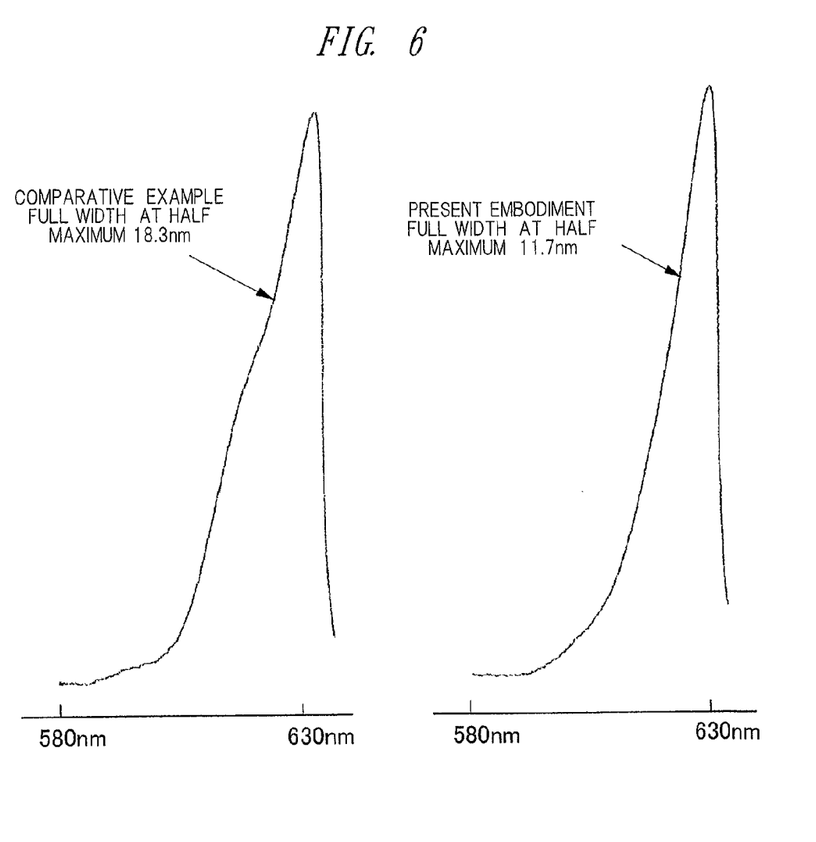
FIG. 6 is a graph illustrating measurement results of photoluminescence wavelengths from active layers of the first embodiment and the comparative example.

FIG. 6 illustrates measurement results of photoluminescence wavelengths from the active layers. While a full width at half maximum of the comparative example described above was 18.3 nm, a full width at half maximum of the present embodiment was 11.7 nm and this is smaller than that of the comparative example. The full width at half maximum indicates quality of the active layer and the result means that the composition ratio or thickness has less fluctuations in the photoluminescence-observed region having a diameter of about 2.5 mm. As to a thickness in the wafer plane upon finishing crystal growth, fluctuations were suppressed to 1% or less in both the present embodiment and the comparative example. Therefore, the change in the full width at half maximum is supposed to be caused by a fluctuation in elemental composition ratio.

More specifically, in the comparative example, it is considered that Al and In which are group III elements locally formed Al-rich regions and/or In-rich regions so that fluctuations in composition ratio occur. Meanwhile, in the present embodiment, it is considered that introduction of Ga brought an effect of averaging fluctuations in composition ratio. More specifically, it is supposed that Ga is easy to be mixed in the local Al-rich regions and/or In-rich regions as Ga has an atomic radius between those of Al and In and thus local Al-rich regions and/or In-rich regions are easier to dissipate as a result. When the local Al-rich regions are dissipated, regions in which local absorption of oxygen and/or moisture often occurs are reduced. Therefore, it is supposed that dislocations by concentration of dislocations and further multiplication of dislocations could be suppressed and it resulted in the high reliability. That is, by using AlGaInP in which a minute amount of Ga was added in the n-type cladding layer, the crystallinity of the n-type cladding layer was improved and it was lead to the improvement in crystallinity in the active layer formed on the n-type cladding layer and thus the effects of improvements in characteristics and reliability were exhibited.

As a modification example of the present embodiment, the n-type cladding layer may be formed of $(Al_{0.92}Ga_{0.08})_{0.5}In_{0.5}P$ (Al composition ratio xn=0.92) and the p-type cladding layer may be formed of $Al_{0.5}In_{0.5}P$ (Al composition ratio xp=1). In this case, the Al composition ratio difference between the cladding layers are larger and thus variations in FFP horizontal half width among wafers will be large in mass production. However, as described in the calculation example in FIG. 3 above, the present modification example is the lower limit that does not pose a problem in view of the standard of the FFP horizontal half width.

When the Al composition ratio difference between the n-type cladding layer and the p-type cladding layer is large, as described above, there is a merit of high-temperature characteristics because the p-type cladding layer can be made thinner etc. However, on the other hand, there is such a tradeoff relationship that there is a demerit of an increase in characteristics variations when the Al composition ratio difference is too large.

Figure 7:
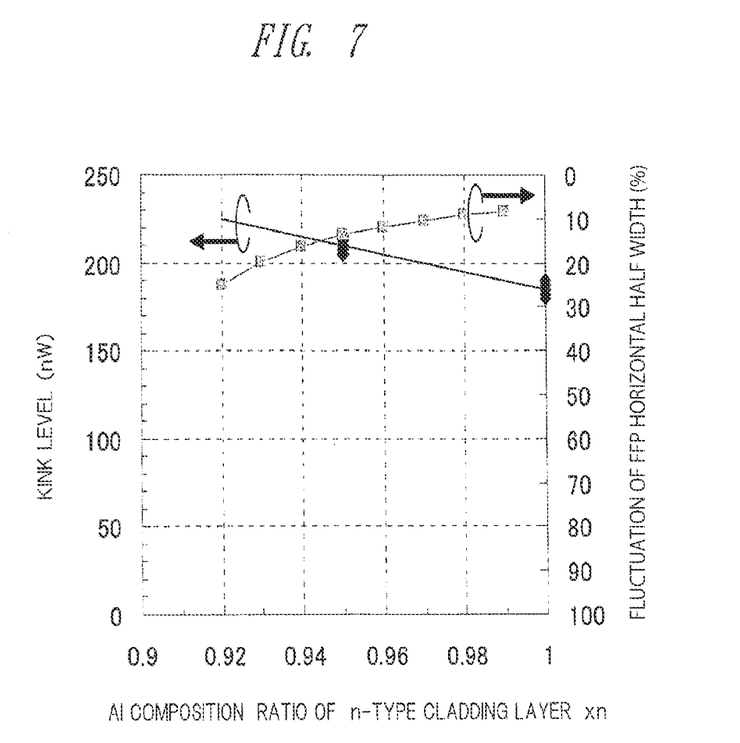
FIG. 7 is a graph illustrating a relationship of a Al composition ratio and fluctuations of an FFP horizontal half width and a relationship of the Al composition ratio and a kink level of the n-type cladding layer.

FIG. 7 illustrates a relation of an Al composition ratio xn of the n-type cladding layer and a variation of FFP horizontal half width and a relation of an Al composition ratio xn of the n-type cladding layer and a kink level (optical output power value in which a kink occurs). Here, the variation of FFP horizontal half width is a value calculated from the calculation result in FIG. 3 and the value is obtained by dividing a difference between the half widths of the variations ±0.01 of the Al composition ratio (xn) by a half width at the center. In addition, the kink level is obtained from actual measured values of the present embodiment and the comparative examples.

A lowering of kink level and an increase in variation of FFP horizontal half width pose an increase in a cost due to a lowering of yield. Therefore, to consider mass production, a difference (xp-xn) between the Al composition ratio (xp) of the p-type cladding layer and the Al composition ratio (xn) of the n-type cladding layer is preferable to be 0.02 or larger.

Also, as a modification example of the present embodiment, a configuration in which As is contained in the active layer can be used. For example, an optical guiding layer is formed of AlGaAs and a well layer is formed with GaAs and a thickness of the well layer is 6 nm. In this case, a near infrared light around 0.83 μm lasing wavelength can be obtained. Generally, near infrared and infrared semiconductor lasers of 0.7 nm to 1 μm lasing wavelength have a cladding layer formed of AlGaAs. On the contrary, when the cladding layer is formed of an AlGaInP-based material, a bandgap difference between the cladding layer and the active layer can be large and thus an improvement in high-temperature characteristics is possible.

Figure 8:
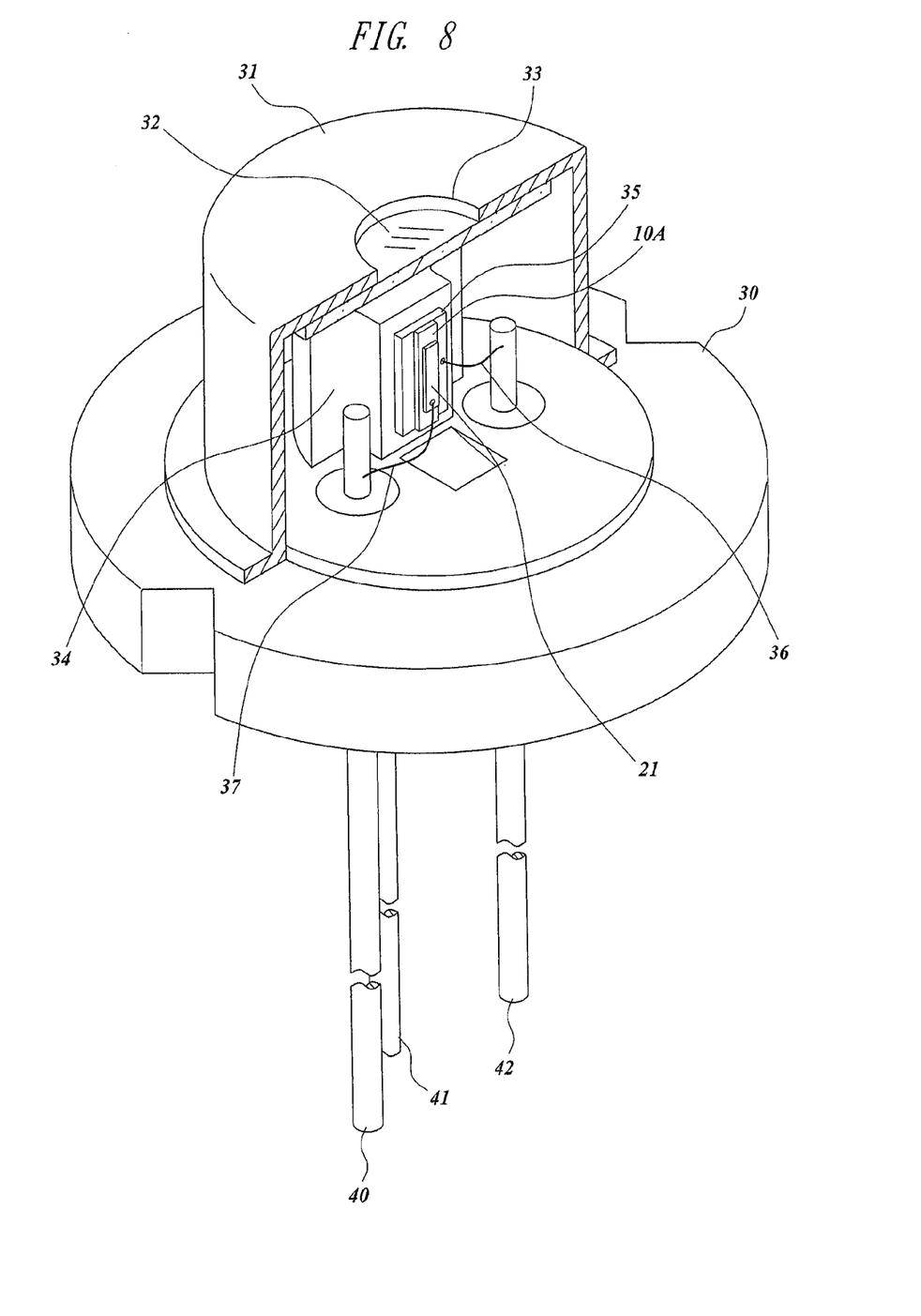
FIG. 8 is a broken perspective view of main parts illustrating a whole configuration of the semiconductor laser device according to the first embodiment of the present invention.

FIG. 8 is a broken perspective view of main parts illustrating a whole configuration of the semiconductor laser of the present embodiment. The semiconductor laser includes: a stem 30 in a disk-like shape formed of a Fe (iron) alloy and having a diameter of about 5.6 mm and a thickness of about 1.2 mm; and a package (sealing container) having a cap 31 for covering an upper surface of the stem 30. An outer perimeter of a bottom portion of the cap 31 is fixed to the upper surface of the stem 30. In addition, a round hole 33 to which a glass plate 32 permeable to laser beam is joined is provided to a center portion of the upper surface of the cap 31.

A heat sink 34 formed of a metal having a good heat conductivity is mounted in a vicinity of a center of the upper surface of the stem 30 covered by the cap 31. The heat sink 34 is joined to the upper surface of the stem via a brazing filler metal (not illustrated) and a submount 35 is fixed to the whole surface of the upper surface of the stem 30 via solder (not illustrated). On the other side, to the lower surface of the stem 30, three leads 40, 41 and 42 are attached.

A laser chip 10A illustrated in FIG. 1 is mounted to a chip-mounting surface of the submount 35 in the junction-down manner. The submount 35 both works as a heat dissipation plate for dissipating heat generated upon light emission of a laser beam to the outside of the laser chip 10A and a supporting substrate for supporting the laser chip 10A.

To the chip-mounting surface of the submount 35, a submount electrode (not illustrated) electrically connected to the p-side electrode 20 (see FIG. 1) of the laser chip 10A is formed and an end of an Au wire 36 is bonded to a surface of the submount electrode. On the other side, an end of an Au wire 37 is bonded to a surface of the n-side electrode 21 of the laser chip 10A.

A laser beam exits from both end facets (upper end facet and lower end facet in FIG. 8) of the laser chip 10A mounted on the submount 35. Thus, the submount 35 supporting the laser chip 10A is fixed to the heat sink 34, so that the chip-mounting surface faces a direction perpendicular to the upper surface of the stem 30. The laser beam (forward light) exited from the upper end facet of the laser chip 10A exits to the outside through the round hole 33 of the cap 31.

(Second Embodiment)

In a second embodiment, in addition to an improvement in high-temperature characteristics and an improvement in crystallinity described in the first embodiment, an effect of an improvement in humidity resistance according to a high-temperature and high-humidity test will be described.

In a semiconductor laser of the second embodiment, an n-type cladding layer is formed of $(Al_{0.91}Ga_{0.09})_{0.5}In_{0.5}P$ (Al composition ratio $xn=0.91$) and a p-type cladding layer is formed of $(Al_{0.96}Ga_{0.04})_{0.5}In_{0.5}P$ (Al composition ratio $xp=0.96$) and the other configuration of the semiconductor laser is the same as that of the first embodiment.

Normally, a semiconductor laser is housed in a package hermetic sealed with a cap and the inside of the cap is maintained in atmosphere like dry air in which moisture is eliminated as much as possible. However, if implementing open-packaging of the semiconductor laser is possible, there are great merits in downsizing and price reduction.

Figure 9:
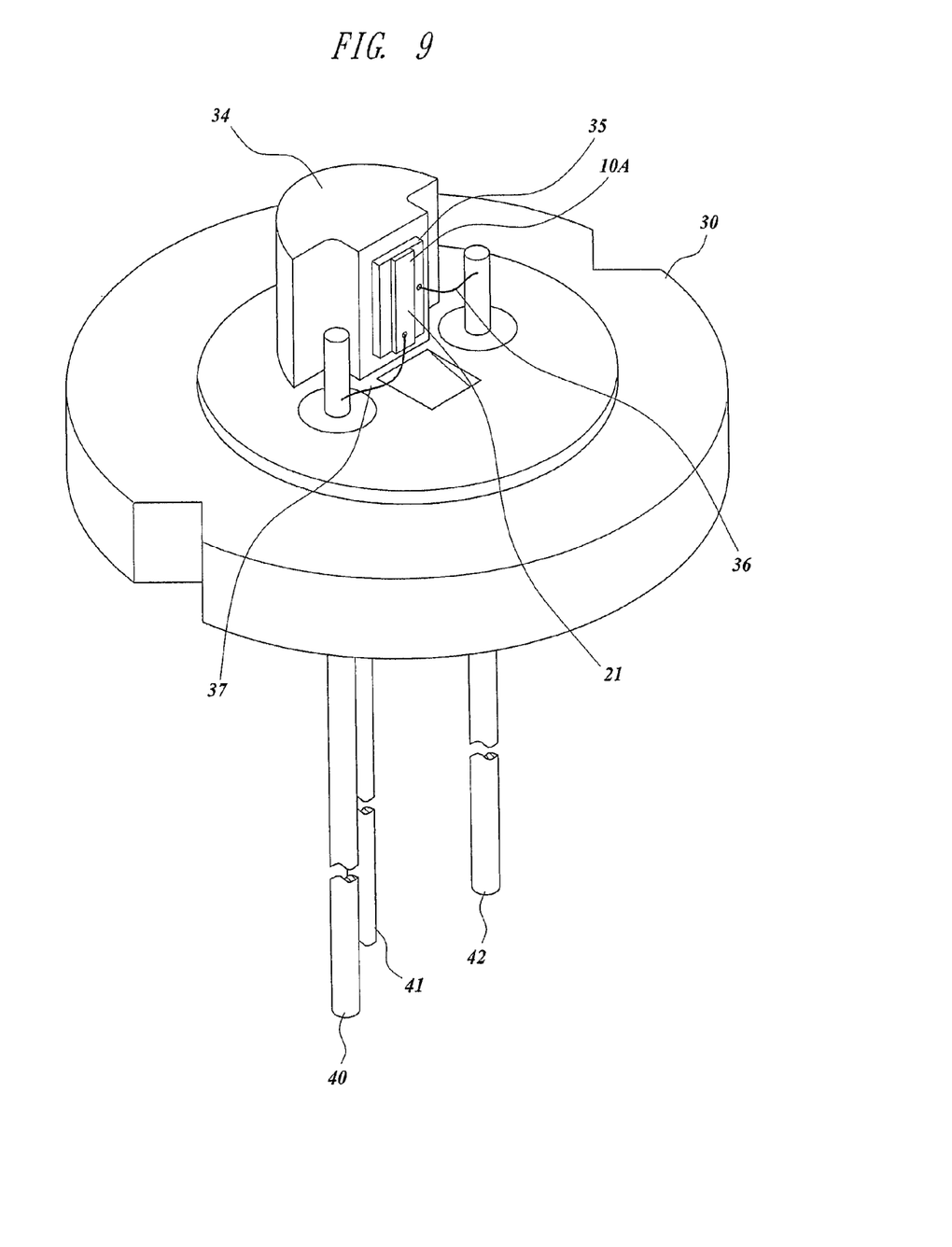
FIG. 9 is a broken perspective view of main parts illustrating a whole configuration of a semiconductor laser device according to a second embodiment of the present invention.

Accordingly, as illustrated in FIG. 9, the laser chip 10A to which the semiconductor laser having the configuration described above was mounted on the submount 35 in the junction-down manner and subjected to a high-temperature and high-humidity test (85° C., 85% RH) without a hermetic sealing with a cap. In addition, the chip of the comparative example used in the first embodiment was mounted on the submount in the junction-down manner and subjected to a high-temperature and high-humidity test (85° C., 85% RH) without a hermetic sealing with a cap.

As a result, in the comparative example, there was no problem occurred until 1000 hours but there was a lowering in characteristics among the laser elements (two in 22 laser elements tested) at 1500 hours. On the other hand, in the present embodiment, no laser element had a lowering in characteristics even after 1500 hours (zero in 22 laser elements tested).

As a result of a visual inspection of the laser element of the comparative example which had a lowering in characteristics, there was a discoloration in the p-type cladding layer at the end facet portions. That is, a reason of the lowering in characteristics in the high-temperature and high-humidity test is considered as corrosion by a reaction of Al in the semiconductor crystal and moisture. On the other hand, in the present embodiment, it is considered that introduction of a minute amount of Ga in semiconductor crystal and increased the resistance to corrosion reaction.

As described above, the upper surface of the p-type cladding layer is covered with the passivation film and the p-side electrode and thus it is considered to be difficult for moisture to intrude from the upper surface of the semiconductor substrate. However, since the end facets are covered only by the passivation film, it is easy for moisture to intrude as compared with the upper surface. A conceivable countermeasure is that the passivation film is formed of a film having a high humidity resistance such as a silicon nitride film. However, there are restrictions in the selection of the passivation film at the end facets in view of reliability and thus desirable characteristics and reliability may not be achieved when the specie of the passivation film is limited. Therefore, increasing the resistance of the semiconductor crystal itself is effective in achieving both good characteristics and good reliability.

(Third Embodiment)

Figure 10:
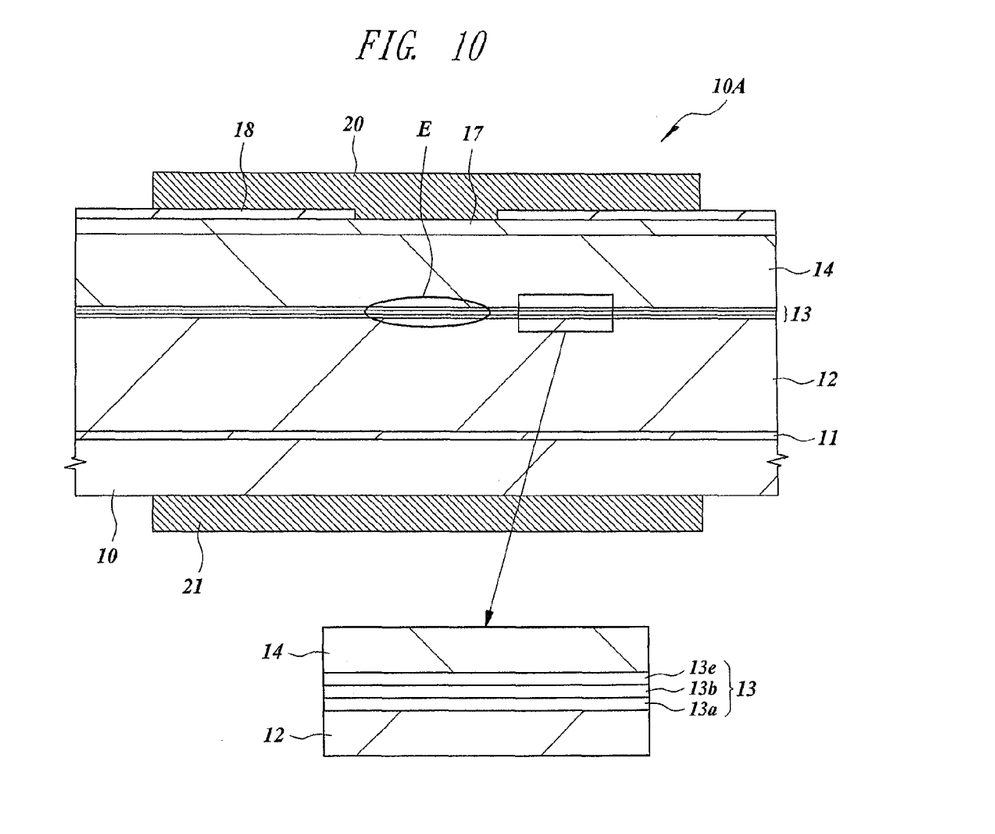
FIG. 10 is a cross-sectional view illustrating a configuration of a main part of a semiconductor laser device according to a third embodiment of the present invention.

In a third embodiment, the present invention is applied to a broad-area red semiconductor laser. FIG. 10 is a cross-sectional view illustrating a configuration of a main part (laser chip) of a semiconductor laser device of the present embodiment.

Generally, a broad-area semiconductor laser achieves higher optical output power and higher heat generation than a ridge semiconductor laser. Therefore, it is more effective to use an asymmetric structure in which an n-type cladding layer and a p-type cladding layer have different Al composition ratios.

In the present embodiment, the n-type cladding layer 12 is formed of $(Al_{0.95}Ga_{0.05})_{0.5}In_{0.5}P$ (Al composition ratio $xn=0.95$) and the p-type cladding layer 14 is formed of $Al_{0.5}In_{0.5}P$ (Al composition ratio $xp=1$). The active layer 13 is formed of a single quantum well (SQW) structure including an optical guiding layer 13a formed of AlGaInP, a well layer 13b formed of GaInP or AlGaInP and an optical guiding layer 13e formed of AlGaInP.

As to the well layer 13b, various lasing wavelengths and oscillation modes can be given by changing its thickness within a range smaller than or equal to a critical thickness, composition and strain. When a tensile strain is given, the thickness is preferably 6 to 18 nm and the Al composition ratio x is preferably 0 to 0.15. For example, to obtain a lasing wavelength of 640 nm, the thickness of the well layer 13b is set to 15 nm, the Al composition ratio x of the well layer 13b is $x=0$, i.e., GaInP is used, and the tensile strain is given at −0.8%. In this case, the laser is oscillated in a TM mode in which components of the electric field of the laser beam are vibrated in a direction perpendicular to the active layer 13.

In addition, a width of a light emitting portion E can be 3 to 200 µm. When the width of the light emitting portion E is set like this, the laser is oscillated in a multimode. The larger the width of the light emitting portion R is, the larger the optical output power is obtained; however, as a threshold current is increased, a heat generation amount is increased and high-temperature characteristics are degraded. For example, to obtain an optical output power of 500 mW, the width of the light emitting portion E is set at 50 µm. Formation of the light emitting portion E may be done in a method of forming a ridge or a method of opening a contact window for current injection.

(Fourth Embodiment)

In a fourth embodiment, in addition to the effect of improving humidity resistance described in the second embodiment, an effect of improving ability of mass production will be described.

In a semiconductor laser of the present embodiment, an n-type cladding layer is formed of $(Al_{0.95}Ga_{0.05})_{0.5}In_{0.5}P$ (Al composition ratio $xn=0.95$) and a p-type cladding layer is formed of $(Al_{0.95}Ga_{0.05})_{0.5}In_{0.5}P$ (Al composition ratio $xp=0.95$). Except for this point, the semiconductor laser of the present embodiment has the same configuration as the first embodiment. That is, in the semiconductor laser of the present embodiment, the Al composition ratio xp of the p-type cladding layer and the Al composition ratio xn of the n-type cladding layer are the same ($xp=xn$).

When the cladding layers are formed by MOCVD, a composition ratio of Al and Ga is adjusted by a flow rate of an organic metal gas. However, when the Al composition ratio is high like the present embodiment, since a flow rate of Ga is little and it is close to a limitation in accuracy of a flow rate meter, variations in composition is large among wafers (wafers with different growth batches). According to a confirmation of variations in the composition ratio of Al and Ga (Al composition ratio x) among wafers, there were variations of about ±0.01 found with respect to a target value. The result means that, in the case of the second embodiment, an actually formed n-type cladding layer may have an Al composition ratio $xn=0.9$ to 0.92 while a target value is $xn=0.91$, and an actually formed p-type cladding layer may have an Al composition ratio xp=0.95 to 0.97 while a target value is xp=0.96. Therefore, when the Al composition ratio x differs in the p-type cladding layer and n-type cladding layer like the second embodiment, not only variations among wafers but also variations in composition among the cladding layers will occur, increasing variations in characteristics among semiconductor lasers and posing a yield lowering.

On the other hand, in the case of the fourth embodiment, since the n-type cladding layer and p-type cladding layer can be successively formed with setting flow rate ratios of Al and Ga identical, there is little difference in the Al composition ratio between the n-type cladding layer and the p-type cladding layer and thus what should be considered is only variations among wafers. Therefore, as compared with the semiconductor laser in which the Al composition ratio x differs in the p-type cladding layer and n-type cladding layer, variations in characteristics can be suppressed and thus an improvement in yield and an improvement in ability of mass production can be achieved.

Also, as a modification example of the present embodiment, the n-type cladding layer can be formed of $(Al_{0.91}Ga_{0.09})_{0.5}In_{0.5}P$ (Al composition ratio xn=0.91) and a p-type cladding layer is formed of $(Al_{0.91}Ga_{0.09})_{0.5}In_{0.5}P$ (Al composition ratio xp=0.91). When the Al composition ratio xp of the p-type cladding layer is reduced, high-temperature characteristics are lowered but humidity resistance is improved. This case is on the assumption that the usage environment is severe and thus the Al composition ratio x can be set within the range of the present invention in accordance with a required usage.

While the first to fourth embodiments of the present invention made by the inventors have been concretely described in the foregoing, to obtain the effects of the present invention in view of high-temperature characteristics, reliability and ability of mass production, the Al composition ratio (xp) of the p-type cladding layer is preferable to be in the range of $0.9 < xp \le 1$ and the Al composition ratio (xn) of the n-type cladding layer is preferable to be in the range of $0.9 < xn < 1$ and also a difference between xp and xn is preferable to be in the range of $0 \le xp - xn \le 0.08$.

Further, it is needless to say that the present invention is not limited to the foregoing embodiments and various modifications and alterations can be made within the scope of the present invention.

While the present invention has been applied to an AlGaInP-based red semiconductor laser having a lasing wavelength of 640 nm for example in the embodiments described above, since an AlGaInP-based semiconductor laser can achieve a lasing wavelength of 0.6 μm to 0.7 μm by changing only the design of the active layer, the present invention can be applied to an AlGaInP-based semiconductor laser which is oscillated by a lasing wavelength of 0.6 μm to 0.7 μm.

In addition, since a lasing wavelength of 0.7 μm to 1 μm can be achieved when As is contained in the active layer, the present invention can be applied to near-infrared and infrared semiconductor lasers which are oscillated by a lasing wavelength of 0.7 nm to 1 μm in which an AlGaInP-based material is used in a cladding layer and also As is contained in an active layer.

Moreover, the present invention can be applied to an array laser in which a plurality of semiconductor lasers are arrayed or a multi-beam laser.

The present invention is applicable to AlGaInP-based semiconductor lasers.

What is claimed is:

1. A semiconductor laser chip comprising:
   an n-type cladding layer having a composition of $(Al_{xn}Ga_{1-xn})0.5 In_{0.5}P$;
   a p-type cladding layer having a composition of $(Al_{xp}Ga_{1-xp})0.5 In_{0.5}P$ where xp is 1;
   a ridge portion configured for optical confinement, located on the p-type cladding layer;
   an active layer provided between the n-type cladding layer and the p-type cladding layer,
   an n-side electrode located on the n-type cladding layer;
   a p-side electrode located on the ridge portion; and
   wherein a difference between the Al composition ratio xp of the p-type cladding layer and the Al composition ratio xn of the n-type cladding layer satisfies a relationship of $0.02 < xp - xn \le 0.05$.

2. The semiconductor laser chip according to claim 1, wherein a dopant concentration of the p-type cladding layer is within a range from $6 \times 10^{17}$ cm$^{-3}$ to $1.3 \times 10^{18}$ cm$^{-3}$.

3. The semiconductor laser chip according to claim 1, wherein a dopant concentration of the n-type cladding layer is within a range from $1 \times 10^{17}$ cm$^{-3}$ to $6 \times 10^{17}$ cm$^{-3}$.

4. The semiconductor laser chip according to claim 1, wherein a dopant concentration of the p-type cladding layer is higher than a dopant concentration of the n-type cladding layer.

5. The semiconductor laser chip according to claim 1, wherein a thickness of the p-type cladding layer is smaller than a thickness of the n-type cladding layer.

6. The semiconductor laser chip according to claim 1, wherein the active layer is formed of GaInP or AlGaInP, includes one or two well layers having a thickness from 3 nm to 6 nm, and is oscillated in a TE mode.

7. The semiconductor laser chip according to claim 1, further comprising:
   a submount mounting a semiconductor chip to which the semiconductor laser is formed in a junction-down manner;
   a stem loading the sub mount; and
   a package in contact with the stem, in which the semiconductor chip is hermetic sealed with a cap.

8. The semiconductor laser chip according to claim 1, wherein xn is 0.95.

9. The semiconductor laser chip according to claim 1, wherein xn is 0.96.

10. The semiconductor laser chip according to claim 1, wherein xn is 0.97.

11. The semiconductor laser chip according to claim 1, wherein the active layer comprises:
    a first optical guiding layer;
    a second optical guiding layer;
    a first well layer;
    a second well layer; and
    a barrier layer.

12. The semiconductor laser chip according to claim 11, wherein the first optical guiding layer and the second optical guiding layer are formed of un-doped AlGaInP.

13. The semiconductor laser chip according to claim 12, wherein the first well layer and the second well layer are formed from un-doped GaInP or AlGaInP.

14. The semiconductor laser chip according to claim 13, wherein the barrier layer is formed from un-doped AlGaInP.

15. The semiconductor laser chip according to claim 13, wherein said barrier layer is between 5 nm and 10 nm thick.

16. The semiconductor laser chip according to claim 11, wherein the first optical guiding layer and the second optical guiding layer are formed from $(Al_xGa_{1-x})_{0.5}In_{0.5}P$, and wherein an Al composition ratio of x is from 0.4 to 0.8.

17. The semiconductor laser chip according to claim 11, wherein the first well layer and the second well layer are formed from $(Al_xGa_{1-x})_{0.5}In_{0.5}P$, and wherein an Al composition ratio of x is from 0 to 0.15.

18. The semiconductor laser chip according to claim 11, wherein the barrier layer is formed from $(Al_xGa_{1-x})_{0.5}In_{0.5}P$ and wherein the Al composition ratio of x is from 0.4 to 0.8.

19. The semiconductor laser chip according to claim 11, wherein the first optical guiding layer and the second optical guiding layer are from between 20 nm and 150 nm thick.

20. The semiconductor laser chip according to claim 11, wherein the first well layer and the second well layer are from between 3 nm and 6 nm thick.

* * * * *